United States Patent
Zhou et al.

(10) Patent No.: US 10,504,926 B2
(45) Date of Patent: Dec. 10, 2019

(54) THIN FILM TRANSISTOR, METHOD FOR FABRICATING THE SAME, ARRAY SUBSTRATE, AND DISPLAY PANEL

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Qiang Zhou, Beijing (CN); Chaofan Zhu, Beijing (CN); Xingfeng Ren, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/778,719

(22) PCT Filed: Oct. 17, 2017

(86) PCT No.: PCT/CN2017/106504
§ 371 (c)(1),
(2) Date: May 24, 2018

(87) PCT Pub. No.: WO2018/077065
PCT Pub. Date: May 3, 2018

(65) Prior Publication Data
US 2018/0350847 A1 Dec. 6, 2018

(30) Foreign Application Priority Data
Oct. 31, 2016 (CN) .......................... 2016 1 0943113

(51) Int. Cl.
*H01L 27/12* (2006.01)
*H01L 21/768* (2006.01)
(Continued)

(52) U.S. Cl.
CPC .... *H01L 27/1225* (2013.01); *H01L 21/76829* (2013.01); *H01L 27/127* (2013.01);
(Continued)

(58) Field of Classification Search
CPC ........... H01L 27/1225; H01L 29/66969; H01L 27/1214; H01L 29/78681; H01L 29/7869;
(Continued)

(56) References Cited

U.S. PATENT DOCUMENTS 8,494,119 B2 * 7/2013 Andersson ................ H01J 5/18
378/145
8,872,159 B2 * 10/2014 Kub ...................... H01L 27/148
257/21
(Continued)

FOREIGN PATENT DOCUMENTS

CN 102651401 A 8/2012
CN 103021959 A 4/2013
(Continued)

OTHER PUBLICATIONS

English Machine Translation of CN105140239B, Thin film transistor, manufacturing method thereof, array substrate and manufacturing method thereof, Google Patents, https://patents.google.com/patent/CN105140239B/zh, date accessed Jan. 21, 2019, 8 pages (Year: 2015).*
(Continued)

*Primary Examiner* — Earl N Taylor
(74) *Attorney, Agent, or Firm* — Calfee, Halter & Griswold LLP

(57) ABSTRACT

A thin film transistor, a method for fabricating the same, an array substrate, and a display panel are disclosed. The
(Continued)

method includes: forming a semiconductor film comprising metallic elements, an etching stop film, and a source and drain film on a substrate in this order; and forming a pattern comprising an active layer, an etching stop layer, and a source and drain on the active layer by using a same mask plate, wherein the etching stop layer electrically connects the source and drain with the active layer. Since an etching stop film is formed on a semiconductor film comprising metallic elements, during etching the metal layer, the etching stop film can protect the semiconductor film comprising metallic elements from being etched, and this ensures the performance of the resultant active layer.

11 Claims, 2 Drawing Sheets

(51) Int. Cl.
*H01L 29/786* (2006.01)
*H01L 29/66* (2006.01)

(52) U.S. Cl.
CPC ...... *H01L 27/1214* (2013.01); *H01L 27/1262* (2013.01); *H01L 27/1288* (2013.01); *H01L 29/66765* (2013.01); *H01L 29/66969* (2013.01); *H01L 29/7869* (2013.01); *H01L 29/78681* (2013.01)

(58) Field of Classification Search
CPC ........... H01L 29/66765; H01L 27/1262; H01L 27/1288; H01L 21/76829; H01L 27/127
See application file for complete search history.

(56) References Cited

U.S. PATENT DOCUMENTS

| | | | | | |
|---|---|---|---|---|---|
| 9,029,833 | B2* | 5/2015 | Kub | ...................... | H01L 27/148 257/21 |
| 9,331,165 | B2* | 5/2016 | Liu | ......................... | H01L 29/45 |
| 9,391,097 | B2* | 7/2016 | Yuan | .................... | H01L 29/7869 |
| 9,412,556 | B2* | 8/2016 | Khalid | .................... | H01J 37/26 |
| 9,543,156 | B1* | 1/2017 | Hu | ..................... | H01L 21/28247 |
| 9,564,252 | B2* | 2/2017 | Kostamo | ................ | B82Y 30/00 |
| 9,577,049 | B1* | 2/2017 | Lin | ......................... | H01L 29/45 |
| 9,728,647 | B2* | 8/2017 | Wu | ......................... | H01L 29/06 |
| 9,882,055 | B2* | 1/2018 | Wu | ......................... | H01L 29/06 |
| 9,905,434 | B2* | 2/2018 | Yoo | ......................... | H01L 21/77 |
| 2004/0263757 | A1* | 12/2004 | Kwon | ............... | G02F 1/134363 349/149 |
| 2008/0296568 | A1* | 12/2008 | Ryu | .................. | H01L 21/02554 257/43 |
| 2009/0153056 | A1* | 6/2009 | Chen | ..................... | H01L 29/458 315/51 |
| 2010/0163868 | A1* | 7/2010 | Yamazaki | ........... | H01L 27/1225 257/43 |
| 2010/0181565 | A1* | 7/2010 | Sakata | .................. | C23C 14/086 257/43 |
| 2010/0187523 | A1* | 7/2010 | Sakata | .................... | H01L 29/16 257/43 |
| 2010/0244020 | A1* | 9/2010 | Sakata | ............. | H01L 21/02554 257/43 |
| 2011/0084267 | A1* | 4/2011 | Yamazaki | ......... | H01L 29/42384 257/43 |
| 2011/0311029 | A1* | 12/2011 | Andersson | ................ | H01J 5/18 378/161 |
| 2013/0001573 | A1* | 1/2013 | Lee | ......................... | H01L 29/45 257/60 |
| 2013/0032794 | A1* | 2/2013 | Lee | ......................... | H01L 29/45 257/43 |
| 2013/0043475 | A1* | 2/2013 | Kim | .................. | H01L 29/78633 257/59 |
| 2013/0082241 | A1* | 4/2013 | Kub | ...................... | H01L 27/148 257/21 |
| 2013/0109190 | A1* | 5/2013 | Lill | .................... | H01J 37/32146 438/714 |
| 2013/0302939 | A1* | 11/2013 | Liu | .................... | H01L 29/66969 438/104 |
| 2014/0077203 | A1* | 3/2014 | Yuan | .................... | H01L 29/7869 257/43 |
| 2014/0110716 | A1* | 4/2014 | Liu | .................. | H01L 29/42384 257/59 |
| 2014/0367824 | A1* | 12/2014 | Kub | ...................... | H01L 27/148 257/460 |
| 2015/0118126 | A1* | 4/2015 | Khalid | .................... | H01J 37/26 422/503 |
| 2015/0214320 | A1* | 7/2015 | Liu | ......................... | H01L 29/45 257/43 |
| 2017/0053908 | A1* | 2/2017 | Hoffman | ............... | H01L 27/085 |
| 2017/0102358 | A1* | 4/2017 | Hoffman | ........... | H01L 21/76883 |
| 2017/0141236 | A1* | 5/2017 | Wu | ......................... | H01L 29/06 |
| 2017/0271524 | A1* | 9/2017 | Wu | ......................... | H01L 29/06 |
| 2018/0040700 | A1* | 2/2018 | Hussain | ............ | H01L 21/02381 |
| 2018/0122914 | A1* | 5/2018 | Li | ......................... | H01L 29/45 |
| 2018/0138210 | A1* | 5/2018 | Yuan | ..................... | H01L 29/786 |
| 2018/0166333 | A1* | 6/2018 | Yang | ................. | H01L 21/76843 |
| 2018/0350847 | A1* | 12/2018 | Zhou | ................ | H01L 29/66969 |

FOREIGN PATENT DOCUMENTS

CN 105140239 A 12/2015
CN 106298546 A 1/2017

OTHER PUBLICATIONS

First Office Action for Chinese Patent Application No. 201610943113.4 dated May 24, 2017.
Second Office Action for Chinese Patent Application No. 201610943113.4 dated Sep. 13, 2017.
Decision on Rejection for Chinese Patent Application No. 201610943113.4 dated Jan. 24, 2018.
Search Report for Chinese Patent Application No. 201610943113.4 dated Feb. 28, 2017.
Search Report and Written Opinion for International Application No. PCT/CN2017/106504 dated Jan. 29, 2018.

* cited by examiner

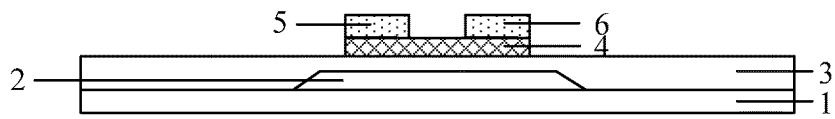
Fig. 1
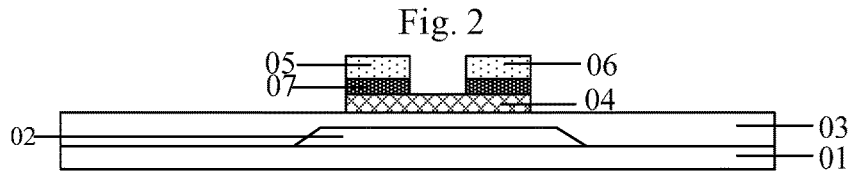
Fig. 2
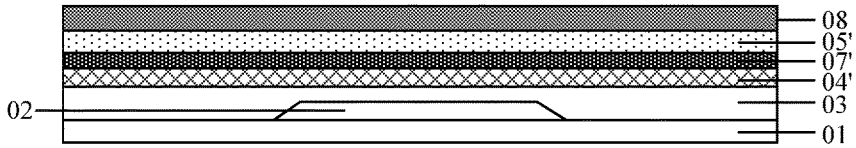
Fig. 3
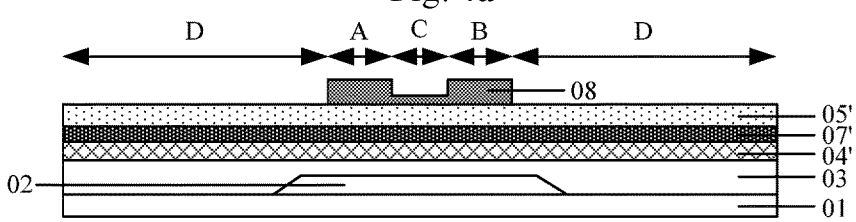
Fig. 4a
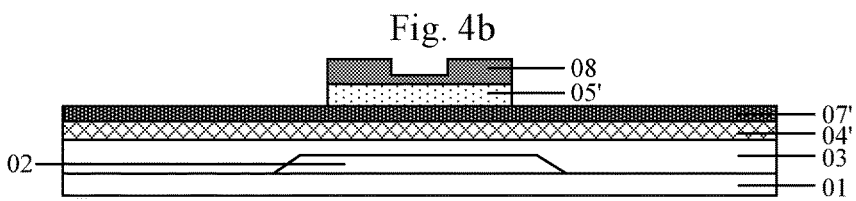
Fig. 4b
Fig. 4c

THIN FILM TRANSISTOR, METHOD FOR FABRICATING THE SAME, ARRAY SUBSTRATE, AND DISPLAY PANEL

RELATED APPLICATIONS

The present application is the U.S. national phase entry of PCT/CN2017/106504, with an international filing date of Oct. 17, 2017, which claims the benefit of Chinese Patent Application No. 201610943113.4, filed on Oct. 31, 2016, the entire disclosures of which are incorporated herein by reference.

TECHNICAL FIELD

The present disclosure relates to the field of display technologies, and particularly to a thin film transistor, a method for fabricating the same, an array substrate, and a display panel.

BACKGROUND

A thin film transistor (TFT) plays a key role in a display device. As a non-linear switching element, the thin film transistor has been widely applied to a large size LCD display and AM-OLED display.

An active layer of the thin film transistor may be a semiconductor material comprising metallic elements, for example a metal oxide semiconductor material, or a metal-doped semiconductor material. In this case, during etching a metal layer to form a source and a drain, since the active layer comprises metallic elements, this etching will damage the active layer region between the source and the drain. This results in that the design requirements cannot be met, the mobility is reduced, and the performance of thin film transistor is affected.

SUMMARY

Embodiments of the present disclosure provides a thin film transistor, a method for fabricating the same, an array substrate, and a display panel, which alleviates or overcomes one or more of the above defects.

In a first aspect, the present disclosure provides a method for fabricating a thin film transistor, comprising:

forming a semiconductor film comprising metallic elements, an etching stop film, and a source and drain film on a substrate in this order; and forming a pattern comprising an active layer, an etching stop layer, and a source and drain on the active layer by using a same mask plate, wherein the etching stop layer electrically connects the source and drain with the active layer.

For example, forming the pattern comprising the active layer, the etching stop layer, and the source and drain on the active layer by using a same mask plate comprises:

coating a photoresist layer on the source and drain film;

exposing and developing the photoresist layer by using a gray tone mask plate, to form a first photoresist completely retained region in a region corresponding to a pattern of source to be formed, forming a second photoresist completely retained region in a region corresponding to a pattern of drain to be formed, forming a photoresist partially retained region in a region between the region corresponding to the pattern of source to be formed and the region corresponding to the pattern of drain to be formed, and forming a photoresist completely removed region surrounding the region corresponding to a pattern of active layer to be formed; and etching the source and drain film, the etching stop film, and the semiconductor film comprising metallic elements by using the photoresist layer, to form a pattern comprising the source, the drain, and the active layer.

For example, etching the source and drain film, the etching stop film, and the semiconductor film comprising metallic elements by using the photoresist layer to form the pattern comprising the source, the drain and the active layer comprises:

wet etching the source and drain film for a first time, to retain the source and drain film in a region corresponding to the first photoresist completely retained region, the second photoresist completely retained region, and the photoresist partially retained;

dry etching the etching stop film for a first time, to retain the etching stop film in a region corresponding to the first photoresist completely retained region, the second photoresist completely retained region, and the photoresist partially retained;

ashing the photoresist layer in the first photoresist completely retained region, the second photoresist completely retained region, and the photoresist partially retained region, to completely remove the photoresist layer in the photoresist partially retained region, and thin the photoresist layer in the first photoresist completely retained region and the second photoresist completely retained region;

wet etching the source and drain film for a second time, to retain the source and drain film in a region corresponding to the first photoresist completely retained region and the second photoresist completely retained region, so as to form a pattern comprising source and drain;

wet etching the semiconductor film comprising metallic elements, to retain the semiconductor film comprising metallic elements in a region corresponding to the first photoresist completely retained region, the second photoresist completely retained region, and the photoresist partially retained region, so as to form a pattern comprising active layer;

dry etching the etching stop film for a second time, to remove the etching stop film in a region corresponding to the photoresist partially retained region; and removing the photoresist layer in the first photoresist completely retained region and the second photoresist completely retained region.

For example, prior to forming the semiconductor film comprising metallic elements, the etching stop film, and the source and drain film on the substrate in this order, the method further comprises: forming a pattern comprising gate and a gate insulating layer covering the pattern comprising gate on the substrate, and wherein forming the semiconductor film comprising metallic elements, the etching stop film, and the source and drain film on the substrate in this order, comprises: forming the semiconductor film comprising metallic elements, the etching stop film, and the source and drain film on the substrate on which the pattern comprising gate and the gate insulating layer have been formed.

For example, the semiconductor film comprising metallic elements comprises a metal oxide semiconductor material or a metal-doped semiconductor material.

For example, the etching stop film comprises graphite, graphene, or a carbon nanomaterial. For example, the etching stop film comprises a mixture of a non-metal oxide and at least one of graphite, graphene, and a carbon nanomaterial. For example, the etching stop film comprises a non-metal dopant.

For example, the etching stop film has a thickness of about 800 Å~3000 Å.

In a second aspect, the present disclosure provides a thin film transistor, comprising a substrate, a semiconductor active layer comprising metallic elements on the substrate, a source and drain on the active layer, and an etching stop layer between the source and the active layer and between the drain and the active layer, wherein the etching stop layer electrically connects the source and drain with the active layer.

In a third aspect, the present disclosure provides an array substrate, comprising the thin film transistor as described above.

In fourth aspect, the present disclosure provides a display device, comprising the array substrate as described above.

BRIEF DESCRIPTION OF THE DRAWINGS

FIG. 1 is a structural view for illustrating a thin film transistor;
FIG. 2 is a flow chart for illustrating a method for fabricating a thin film transistor in an embodiment of the present disclosure;
FIG. 3 is a structural view for illustrating a thin film transistor in an embodiment of the present disclosure; and
FIGS. 4a, 4b, 4c, 4d, 4e, 4f, 4g and 4h are structural views for illustrating a thin film transistor during fabricating process in an embodiment of the present disclosure.

DETAILED DESCRIPTION OF EMBODIMENTS

Figure 4D:
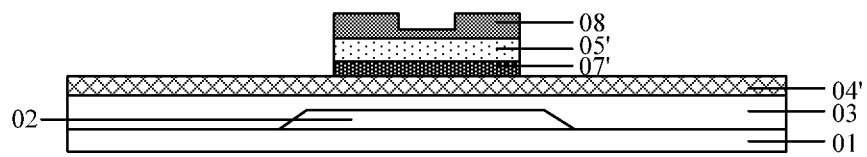

A thin film transistor, a method for fabricating the same, an array substrate, and a display panel in embodiments of the present disclosure will be described in detail hereinafter with reference to the accompanying drawings and specific implementations.

Currently, as shown in FIG. 1, a conventional thin film transistor of a bottom gate type comprises a substrate 1, a gate 2 on the substrate 1, an active layer 4 insulated from the gate 2 by an insulating layer 3, a source 5 and a drain 6 which are electrically connected with the active layer 4. As for the thin film transistor in which the active layer 4 is formed by a semiconductor material comprising metallic elements, during etching a metal layer to form the source 5 and the drain 6, since the active layer 4 also comprises metallic elements, such an etching will damage the active layer region between the source 5 and the drain 6. This results in that the design requirements cannot be met, the mobility is reduced, and the performance of thin film transistor is affected.

In an embodiment of the present disclosure, a method for fabricating a thin film transistor is provided. As shown in FIG. 2, the method comprises the following steps:
step 210, forming a semiconductor film comprising metallic elements, an etching stop film, and a source and drain film on a substrate in this order; and
step 220, forming a pattern comprising an active layer, an etching stop layer, and a source and drain on the active layer by using a same mask plate, wherein the etching stop layer electrically connects the source and drain with the active layer.

The etching stop film can protect the semiconductor film comprising metallic elements during etching the metal layer. Since the etching stop film is formed on the semiconductor film comprising metallic elements, during a patterning process, the etching stop film protects the semiconductor film comprising metallic elements from being etched, thus ensuring the performance of the resultant active layer.

Besides, the method for etching the etching stop film is different from the method for etching the semiconductor film comprising metallic elements, so that there is no damage to the semiconductor film comprising metallic elements.

Furthermore, in the present method, the pattern comprising the source, the drain, the etching stop layer and the active layer is formed by etching only by using a same mask plate. This decreases the masking times, simplifies the process, and reduces the cost.

In implementations, for example, the step 220 comprises the following steps:
coating a photoresist layer on the source and drain film;
exposing and developing the photoresist layer by using a gray tone mask plate, to form a first photoresist completely retained region in a region corresponding to a pattern of source to be formed, forming a second photoresist completely retained region in a region corresponding to a pattern of drain to be formed, forming a photoresist partially retained region in a region between the region corresponding to the pattern of source to be formed and the region corresponding to the pattern of drain to be formed, and forming a photoresist completely removed region surrounding the region corresponding to a pattern of active layer to be formed; and
etching the source and drain film, the etching stop film, and the semiconductor film comprising metallic elements by using the photoresist layer, to form a pattern comprising the source, the drain, and the active layer.

In this embodiment, a gray tone mask plate is used to form a mask. In implementations, a half tone mask plate can be used to form a mask.

In implementations, for example, etching the source and drain film, the etching stop film, and the semiconductor film comprising metallic elements by using the photoresist layer to form the pattern comprising the source, the drain and the active layer comprises:
wet etching the source and drain film for a first time, to retain the source and drain film in a region corresponding to the first photoresist completely retained region, the second photoresist completely retained region, and the photoresist partially retained;
dry etching the etching stop film for a first time, to retain the etching stop film in a region corresponding to the first photoresist completely retained region, the second photoresist completely retained region, and the photoresist partially retained; ashing the photoresist layer in the first photoresist completely retained region, the second photoresist completely retained region, and the photoresist partially retained region, to completely remove the photoresist layer in the photoresist partially retained region, and thin the photoresist layer in the first photoresist completely retained region and the second photoresist completely retained region;
wet etching the source and drain film for a second time, to retain the source and drain film in a region corresponding to the first photoresist completely retained region and the second photoresist completely retained region, so as to form a pattern comprising source and drain;
wet etching the semiconductor film comprising metallic elements, to retain the semiconductor film comprising metallic elements in a region corresponding to the first photoresist completely retained region, the second photoresist completely retained region, and the photoresist partially retained region, so as to form a pattern comprising active layer;

dry etching the etching stop film for a second time, to remove the etching stop film in a region corresponding to the photoresist partially retained region; and removing the photoresist layer in the first photoresist completely retained region and the second photoresist completely retained region.

In this embodiment, during etching the source and drain film by wet etching, the etching stop film can protect the semiconductor film comprising metallic elements from being etched. The etching stop film is etched by dry etching. Generally the dry etching will not damage to the semiconductor film comprising metallic elements. This further ensures the performance of the resultant active layer.

In the above embodiments, the photoresist can be a positive photoresist, or a negative photoresist.

On basis of any one of the above embodiments, for example, prior to forming the semiconductor film comprising metallic elements, the etching stop film, and the source and drain film on the substrate in this order, the method further comprises: forming a pattern comprising gate and a gate insulating layer covering the pattern comprising gate on the substrate.

Forming the semiconductor film comprising metallic elements, the etching stop film, and the source and drain film on the substrate in this order, comprises: forming the semiconductor film comprising metallic elements, the etching stop film, and the source and drain film on the substrate on which the pattern comprising gate and the gate insulating layer have been formed.

On basis of any one of the above embodiments, for example, the semiconductor film comprising metallic elements can comprise, but not limited to, a metal oxide semiconductor material or a metal-doped semiconductor material.

The metal oxide semiconductor material can be, but not limited to, IGZO.

metal-doped semiconductor material can be, but not limited to, zinc sulfide (ZnS), cadmium telluride (CdTe), copper gallium selenide ($CuGaSe_2$), silver indium telluride ($AgInTe_2$), silver thallium telluride ($AgTlTe_2$), or copper iron tin sulphide ($Cu_2FeSnS_4$).

On basis of any one of the above embodiments, for example, the etching stop film can comprise, but not limited to, graphite, graphene, a carbon nanomaterial; a mixture of a non-metal oxide and at least one of graphite, graphene, and a carbon nanomaterial; or a non-metal dopant. These materials are only some examples for the etching stop film, and the etching stop film can also be made from other materials, provided that it can protect the semiconductor film comprising metallic elements from being etched, and etching of the etching stop film will not damage the semiconductor film. The etching stop film is made from an electrically conductive material, so that the resulting etching stop layer electrically connects the source and drain with the active layer, respectively.

The non-metal dopant can be silicon which is doped with one of boron, nitrogen, phosphorus and arsenic, germanium which is doped with one of boron, nitrogen, phosphorus and arsenic, or other suitable materials.

The non-metal oxide can be, but not limited to, silicon oxide or silicon oxynitride.

The etching stop film has a thickness of about 800 Å~3000 Å. For example, the etching stop film has a thickness of 1000 Å.

On basis of the same inventive concept, an embodiment of the present disclosure further provides a thin film transistor. The thin film transistor is fabricated by the method of any one of the above embodiments. The thin film transistor comprises a substrate, a semiconductor active layer comprising metallic elements on the substrate, a source and drain on the active layer, and an etching stop layer between the source and the active layer and between the drain and the active layer, wherein the etching stop layer electrically connects the source and drain with the active layer.

A thin film transistor and a method for fabricating the same in embodiments of the present disclosure will be described hereinafter in detail, with reference to a specific structure of the thin film transistor.

In this embodiment, the thin film transistor has a structure shown in FIG. 3. The thin film transistor comprises a substrate 01, a gate 02 on the substrate 01, a gate insulating layer 03 covering the gate 02, a pattern comprising active layer 04 of a metal oxide semiconductor material on the gate insulating layer 03, a pattern comprising source 05 and a pattern comprising drain 06 on the pattern comprising active layer 04, and an etching stop layer 07 between the pattern comprising source 05 and the pattern comprising active layer 04 and between the pattern comprising drain 06 and the pattern comprising active layer 04. A method for fabricating this thin film transistor structure for example comprises the following step 1~step 9.

Step 1, the gate 02, the gate insulating layer 03, a metal oxide semiconductor film 04', an etching stop film 07', a source and drain film 05' and a photoresist layer 08 are formed on the substrate 01 in this order, as shown in FIG. 4a.

In this embodiment, the etching stop film is a graphite, and the metal oxide semiconductor film comprises Indium Gallium Zinc Oxide (IGZO).

Step 2, the photoresist layer 08 is exposed and developed. In the photoresist layer 08, a first photoresist completely retained region A is formed in a region corresponding to a pattern of source to be formed, a second photoresist completely retained region B is formed in a region corresponding to the pattern of drain to be formed, a photoresist partially retained region C is formed in a region between the region corresponding to the pattern of source to be formed and the region corresponding to the pattern of drain to be formed, and a photoresist completely removed region D is formed to surround the region corresponding to the pattern of active layer to be formed, as shown in FIG. 4b.

Step 3, the source and drain film 05' is etched for a first time by wet etching, and the source and drain film 05' in regions corresponding to the first photoresist completely retained region A, the second photoresist completely retained region B, and the photoresist partially retained region C is retained, as shown in FIG. 4c.

Step 4, the etching stop film 07' is etched for a first time by dry etching, and the etching stop film 07' in regions corresponding to the first photoresist completely retained region A, the second photoresist completely retained region B, and the photoresist partially retained region C is retained, as shown in FIG. 4d.

Figure 4E:
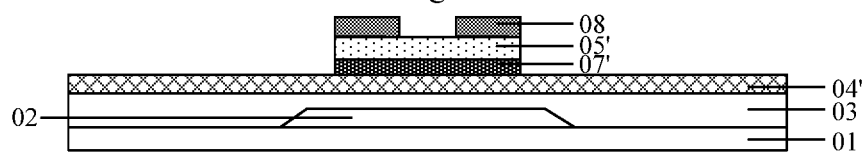

Step 5, the photoresist layer 08 in the first photoresist completely retained region A, the second photoresist completely retained region B, and the photoresist partially retained region C is ashed, to completely remove the photoresist layer 08 the photoresist partially retained region C, and at the same time, to thin the photoresist layer 08 in the first photoresist completely retained region A and the second photoresist completely retained region B, as shown in FIG. 4e.

Figure 4F:
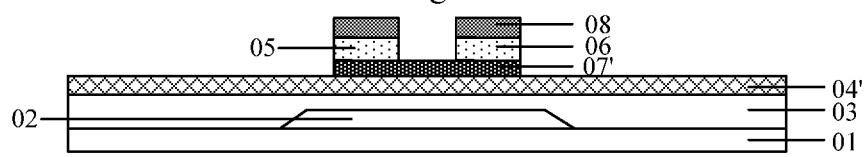

Step 6, the source and drain film 05' is etched for a second time by wet etching, to remove the source and drain film 05' in a region corresponding to the photoresist partially retained region C, and to retain the source and drain film 05' in regions corresponding to the first photoresist completely retained region A and the second photoresist completely retained region B, so as to at least form the pattern comprising source 05 and the pattern comprising drain 06, as shown in FIG. 4f.

Figure 4G:
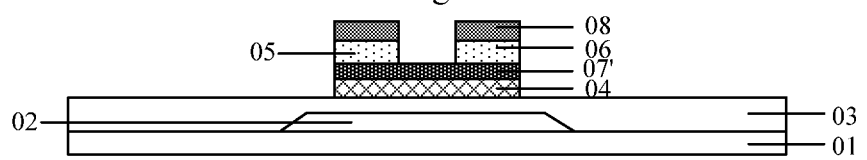

Step 7, the metal oxide semiconductor film 04' is etched by wet etching, to retain the metal oxide semiconductor film 04' in regions corresponding to the first photoresist completely retained region A, the second photoresist completely retained region B and photoresist partially retained region C, so as to at least form the pattern comprising active layer 04, as shown in FIG. 4g.

Figure 4H:
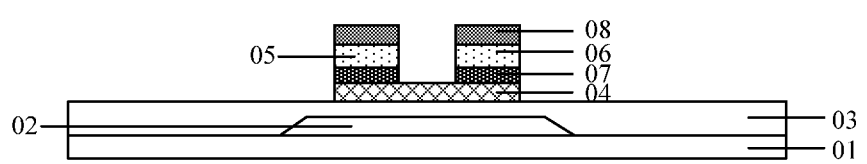

Step 8, the etching stop film 07' is etched for a second time by dry etching, to remove the etching stop film 07' in a region corresponding to the photoresist partially retained region C, as shown in FIG. 4h.

In this step, the etching of the etching stop film 07' is completed, forming the etching stop layer 07 shown in FIG. 3.

Step 9, the photoresist layer 08 in the first photoresist completely retained region A and the second photoresist completely retained region B is removed.

After this step, the thin film transistor with the structure shown in FIG. 3 is obtained.

On basis of the same inventive concept, an embodiment of the present disclosure further provides an array substrate, which comprises the thin film transistor in any one of the above embodiments.

On basis of the same inventive concept, an embodiment of the present disclosure further provides a display device, which comprises the array substrate in any one of the above embodiments. It is noted that the display device can be any product or component with a display function, such as a liquid crystal display panel, electronic paper, an OLED panel, a mobile phone, a tablet computer, a TV set, a monitor, a notebook computer, a digital photo frame, a navigator.

In the thin film transistor, the method for fabricating the same, the array substrate, and the display panel of embodiments of the present disclosure, since an etching stop film is formed on a semiconductor film comprising metallic elements, during etching the metal layer, the etching stop film can protect the semiconductor film comprising metallic elements from being etched, and this ensures the performance of the resultant active layer.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating a thin film transistor, comprising:
    forming a pattern comprising a gate and a gate insulating layer covering the pattern comprising the gate on a substrate;
    forming a semiconductor film comprising metallic elements, an etching stop film, and a source and drain film in this order; and
    etching the semiconductor film comprising metallic elements, the etching stop film, and the source and drain film by using a same mask plate in a patterning process, to form a pattern comprising an active layer, an etching stop layer, and a source and a drain on the active layer, wherein the etching stop layer electrically connects the source and drain with the active layer,
    wherein the etching stop layer comprises a mixture of a non-metal oxide and at least one of graphite, graphene, and a carbon nanomaterial.

2. The method of claim 1, wherein the step of etching the semiconductor film comprising metallic elements, the etching stop film, and the source and drain film by using a same mask plate in a patterning process, to form the pattern comprising the active layer, the etching stop layer, and the source and the drain on the active layer plate comprises:
    coating a photoresist layer on the source and drain film;
    exposing and developing the photoresist layer by using a gray tone mask plate, to form a first photoresist completely retained region in a region corresponding to a pattern of source to be formed, forming a second photoresist completely retained region in a region corresponding to a pattern of drain to be formed, forming a photoresist partially retained region in a region between the region corresponding to the pattern of source to be formed and the region corresponding to the pattern of drain to be formed, and forming a photoresist completely removed region surrounding the region corresponding to a pattern of active layer to be formed; and
    etching the source and drain film, the etching stop film, and the semiconductor film comprising metallic elements by using the photoresist layer, to form a pattern comprising the source, the drain, and the active layer.

3. The method of claim 2, wherein the step of etching the source and drain film, the etching stop film, and the semiconductor film comprising metallic elements by using the photoresist layer to form the pattern comprising the source, the drain and the active layer comprises:
    wet etching the source and drain film for a first time, to retain the source and drain film in a region corresponding to the first photoresist completely retained region, the second photoresist completely retained region, and the photoresist partially retained region;
    dry etching the etching stop film for a first time, to retain the etching stop film in a region corresponding to the first photoresist completely retained region, the second photoresist completely retained region, and the photoresist partially retained region;
    ashing the photoresist layer in the first photoresist completely retained region, the second photoresist completely retained region, and the photoresist partially retained region, to completely remove the photoresist layer in the photoresist partially retained region, and thin the photoresist layer in the first photoresist completely retained region and the second photoresist completely retained region;
    wet etching the source and drain film for a second time, to retain the source and drain film in a region corresponding to the first photoresist completely retained region and the second photoresist completely retained region, so as to form a pattern comprising source and drain;
    wet etching the semiconductor film comprising metallic elements, to retain the semiconductor film comprising metallic elements in a region corresponding to the first photoresist completely retained region, the second photoresist completely retained region, and the photoresist partially retained region, so as to form a pattern comprising active layer;

dry etching the etching stop film for a second time, to remove the etching stop film in a region corresponding to the photoresist partially retained region; and removing the photoresist layer in the first photoresist completely retained region and the second photoresist completely retained region.

4. The method of claim 1, wherein the step of forming the semiconductor film comprising metallic elements, the etching stop film, and the source and drain film in this order, comprises: forming the semiconductor film comprising metallic elements, the etching stop film, and the source and drain film on the substrate on which the pattern comprising the gate and the gate insulating layer have been formed.

5. The method of claim 1, wherein the semiconductor film comprising metallic elements comprises a metal oxide semiconductor material or a metal-doped semiconductor material.

6. The method of claim 1, wherein the etching stop film comprises a non-metal dopant.

7. The method of claim 6, wherein the non-metal dopant is silicon which is doped with one of boron, nitrogen, phosphorus and arsenic, or germanium which is doped with one of boron, nitrogen, phosphorus and arsenic.

8. The method of claim 1, wherein the etching stop film has a thickness of about 800 Å~3000 Å.

9. A thin film transistor, comprising a substrate, a semiconductor active layer comprising metallic elements on the substrate, a source and drain on the active layer, and an etching stop layer between the source and the active layer and between the drain and the active layer, wherein the etching stop layer electrically connects the source and the drain with the active layer, wherein the etching stop layer comprises a mixture of a non-metal oxide and at least one of graphite, graphene, and a carbon nanomaterial.

10. An array substrate, comprising the thin film transistor of claim 9.

11. A display device, comprising the array substrate of claim 10.

* * * * *